United States Patent
Clark et al.

[11] Patent Number: 5,867,893
[45] Date of Patent: Feb. 9, 1999

[54] CLINCH ASSEMBLY LIFT MECHANISM

[75] Inventors: William S. Clark, Hamilton, Mass.;
Rodney Peter Jackson, Auburn, N.H.;
Scott L. Sullivan, New York, N.Y.

[73] Assignee: TDK Corporation of America, Mount Prospect, Ill.

[21] Appl. No.: 778,471

[22] Filed: Jan. 3, 1997

Related U.S. Application Data

[60] Provisional application No. 60/009,666 Jan. 5, 1996 and provisional application No. 60/021,471 Jul. 10, 1996.

[51] Int. Cl.[6] ............................ H05K 13/04; H05K 3/30; B21F 1/00
[52] U.S. Cl. ...................... 29/741; 29/33 M; 29/566.3; 29/838; 140/105
[58] Field of Search ................................ 29/33 F, 33 M, 29/566.3, 739, 741, 838, 844; 140/105

[56] References Cited

U.S. PATENT DOCUMENTS

| | | | |
|---|---|---|---|
| 3,429,170 | 2/1969 | Romeo | 29/566.3 X |
| 3,435,857 | 4/1969 | Ragard et al. | 29/741 X |
| 3,986,533 | 10/1976 | Woodman, Jr. | 140/105 |
| 4,196,513 | 4/1980 | Harigane et al. | 29/741 |
| 4,218,817 | 8/1980 | Takano | 29/741 |
| 4,288,914 | 9/1981 | Vancelette | 29/741 |
| 4,292,727 | 10/1981 | Maxner | 29/566.3 |
| 4,312,109 | 1/1982 | Kawana et al. | 29/566.3 X |
| 4,329,776 | 5/1982 | Mori et al. | 29/741 |
| 4,361,942 | 12/1982 | Mazzola et al. | 29/33 M |
| 4,398,658 | 8/1983 | Snyder et al. | 29/739 X |
| 4,425,947 | 1/1984 | Maxner et al. | 140/105 |
| 4,464,833 | 8/1984 | Duncan | 29/33 M X |
| 4,498,232 | 2/1985 | Ertl | 29/741 |
| 4,516,310 | 5/1985 | Bandura | 29/566.3 |
| 4,543,705 | 10/1985 | Porterfield et al. | 29/566.3 |
| 4,553,323 | 11/1985 | Clark | 29/741 |
| 4,557,043 | 12/1985 | Starski | 29/741 |
| 4,574,462 | 3/1986 | Jackson | 29/566.3 |
| 4,584,758 | 4/1986 | Jackson | 29/566.3 |
| 4,586,237 | 5/1986 | Bandura et al. | 29/566.3 |
| 4,586,544 | 5/1986 | Yagi et al. | 140/105 |
| 4,621,406 | 11/1986 | Fujiwara et al. | 29/566.3 X |
| 4,622,740 | 11/1986 | Mirley, Jr. et al. | 29/741 X |
| 4,711,015 | 12/1987 | Tega et al. | 29/741 X |
| 4,744,799 | 5/1988 | Woodman, Jr. et al. | 29/566.3 |
| 4,759,112 | 7/1988 | McLean et al. | 29/566.3 |
| 4,770,599 | 9/1988 | Hawkswell | 414/752 |
| 4,787,137 | 11/1988 | Jeanmairet et al. | 29/741 X |
| 4,817,266 | 4/1989 | Holcomb | 29/566.3 |
| 4,845,833 | 7/1989 | Weresch | 29/566.3 |
| 5,075,961 | 12/1991 | St. Hilaire | 29/739 |
| 5,165,165 | 11/1992 | Aoki et al. | 29/838 |

*Primary Examiner*—Peter Vo
*Attorney, Agent, or Firm*—Darby & Darby

[57] ABSTRACT

A clinching assembly for use with an insertion machine of the type used to form and insert the lead-wires of an electronic component into openings of a printed circuit board insertion machine. The clinching assembly includes two clinch heads that are selectively movable along a U-axis, parallel to the circuit board. Each clinching assembly is further selectively movable along a Z-axis, perpendicular to the circuit board. A single pneumatic actuator is used to raise and lower both clinch heads simultaneously. A T-shaped linkage attaches each clinch head with the single pneumatic actuator. Vertical movement of the pneumatic actuator is translated through the T-shaped linkage to vertically displace both clinch heads, and simultaneously, allow horizontal displacement of each clinch head, independent of the vertical location of the T-shaped linkage.

7 Claims, 5 Drawing Sheets

CLINCH ASSEMBLY LIFT MECHANISM

This application claims priority under 35 U.S.C. 8,119 (c)(1) of provisioned application Ser. Nos. 60/009,666 filed on Jan. 5, 1996 and 60/021,471 filed on Jul. 10, 1996.

1. Field of the Invention

The present invention relates to machinery for securing wire terminals to planar work pieces, and particularly, to equipment for inserting and securing electronic components to printed circuit boards (PC boards) by cutting and clinching the lead wires of such electronic components.

2. Background of the Invention

Mass-produced printed circuit boards common in the electronics industry are circuit-prepared insulative substrates provided with preformed openings. Each opening is carefully positioned and adapted to receive one lead-wire of a variety of electronic components, including resistors, capacitors, transistors, etc. which are intended to be electrically interconnected with the printed circuit formed on the insulative substrate.

It has been found that such electrical components can be quickly and economically inserted into the appropriate openings of the PC board through the use of automated machines called "inserters" or insertion machines. A typical insertion machine includes three major mechanical assemblies which are each connected to a common frame; a head assembly, a work-support assembly, and a clinching assembly. The insertion machine may be programmed to rapidly form (or otherwise prepare) the lead wires of a variety of electrical components sequentially as they are supplied from adjacent bins, cartridges, or from a pre-sequenced supply ribbon, and position and insert the lead wires of the component into the predetermined openings of the PC board. The head assembly, the work-support assembly, and the clinching assembly of a typical insertion machine function together, and may be analogized to the operation of a desk-top stapler which secures a staple to a collection of sheets of paper, wherein each staple is analogous to a prepared electrical component and the sheets of paper is analogous to a PC board.

The PC board is secured to a work-support table. The work-support table, which is usually selectively pivotal about a vertical Z-axis, is positioned between the head assembly and the clinching assembly. The head assembly and the work-support table move with respect to each other during the operation of the inserter machine to properly align and insert the lead wires of each electrical component into the proper pre-assigned openings of the PC board. The head assembly includes a "lead-former" subassembly which is used to cut an individual electrical component from a supply ribbon, for example, and bend the lead wires (assuming an axial-type lead wire arrangement) into a predetermined shape. A pusher sub-assembly called a "driver", which is also located within the head assembly, pushes prepared (formed) electrical components from the lead-former subassembly through the properly aligned openings of the PC board.

Once a pair of lead wires of a particular electrical component are inserted into the respective openings on the PC board, the clinching assembly cuts excess lead wire material and clinches the remaining lead wire portions of the particular electrical component to the PC board to ensure that secure, reliable and "clean" electrical connections are established.

When all of the desired electrical components are clinched to the PC board in their proper openings, the PC board is removed from the work-support table and moved to undergo subsequent manufacturing processes, including a reflux process during which molten solder is applied to the underside of the PC board to permanently and electrically bond the clinched portions of each lead wire of each electrical component to the actual printed circuit.

The head assemblies of component insertion machines of the type generally described above and under consideration in the present invention are described, for example, in U.S. Pat. No. 3,550,238, U.S. Pat. No. 4,553,323 and U.S. Pat. No. 4,719,810. These patents disclose inserters that are pneumatically and/or servo actuated.

Examples of work-support tables of component insertion machines of the type generally described above and under consideration in the present invention are described in U.S. Pat. No. 4,670,977, U.S. Pat. No. 4,193,186, and U.S. Pat. No. 4,574,660. Examples of clinching devices of component insertion machines of the type generally described above and under consideration in the present invention are described in U.S. Pat. No. 4,584,758, and U.S. Pat. No. 4,292,727.

All patents identified herein are hereby incorporated by reference.

It is an object of the invention to provide a clinching assembly for use with an electronic component inserter machine which overcomes the deficiencies of prior art clinching devices.

SUMMARY OF THE INVENTION

A clinching assembly for use with an insertion machine of the type used to form and insert the lead-wires of an electronic component into openings of a printed circuit board insertion machine. The clinching assembly includes two clinch heads that are selectively movable along a U-axis, parallel to the circuit board. Each clinching assembly is further selectively movable along a Z-axis, perpendicular to the circuit board. A single pneumatic actuator is used to raise and lower both clinch heads simultaneously. A T-shaped linkage attaches each clinch head with the single pneumatic actuator. Vertical movement of the pneumatic actuator is translated through the T-shaped linkage to vertically displace both clinch heads, and simultaneously, allow horizontal displacement of each clinch head, independent of the vertical location of the T-shaped linkage.

DETAILED DESCRIPTION OF THE PREFERRED EMBODIMENTS

Figure 1:
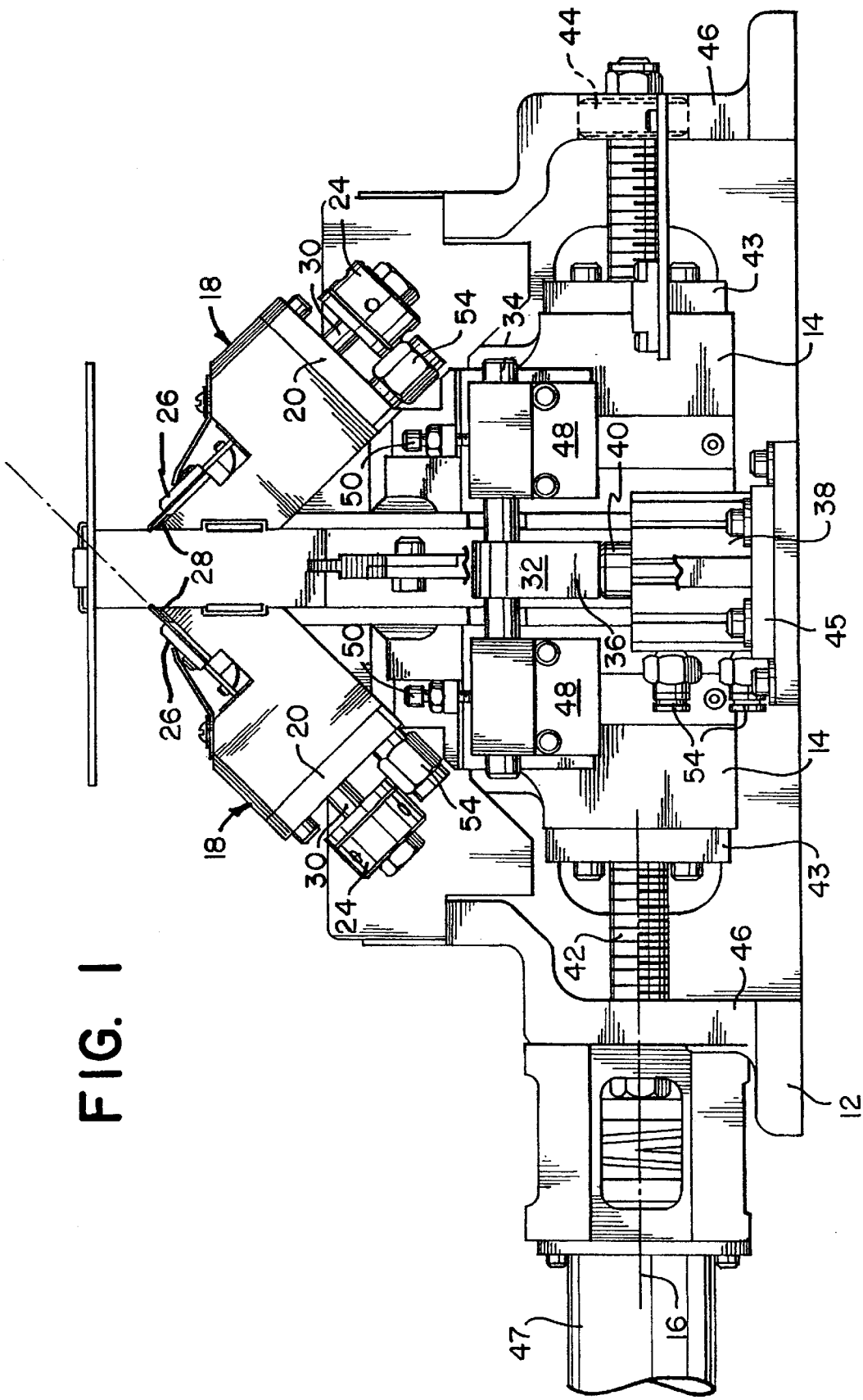
FIG. 1 is a front elevation view of a clinch assembly for use with an insertion machine, showing clinch heads in a lower position, in accordance with the invention.

In accordance with the invention, clinch assembly 10, is shown in FIGS. 1–6, and includes a base 12 which is secured to a frame 13. Base 12 supports two mounting brackets 14 which are selectively movable with respect to each other along a horizontally disposed U-axis 16, as described in greater detail below. Each mounting bracket 14 supports a head assembly 18 which includes a pneumatic actuator 20, one for each lead of an inserted electronic component. Each actuator 20 operates along a cutting axis 22 which is preferably approximately 45 arc degrees from the plane of the PC board (i.e., horizontal), as shown in FIG. 1. Each actuator 20 includes a piston assembly 24, and a cutting assembly 26. As is well known in the art, piston assembly 24 operates by varying air pressure on one side of a piston (not shown) located within a cylinder (not shown). The piston of each actuator 20 is connected to a cutting blade 28 through an actuator rod 30. Application of air pressure to each head assembly 18 results in movement of cutter blade 28 along its respective cutting axis 22 to cut and clinch the inserted lead wire, as is known in the art.

Each head assembly 18 is slidably mounted to its respective mounting bracket 14 using an appropriate linear bearing arrangement which allows vertical movement of each head assembly 14 (parallel to a Z-axis), with respect to base 12. A T-shaped connector bar 32 (hereinafter referred to as a "T-bar 32") includes a horizontal portion 34, which is slidably connected to each head assembly 18, and a vertical portion 36 which includes a bore 35 located at an upper end. Bore 35 is sized and shaped to snugly receive horizontal portion 34. A set screw 37 is rotatably attached to vertical portion 36 and adapted to intersect with bore 35 so that horizontal portion 34 may be secured with respect to vertical portion 36, as shown in the figures, particularly, FIGS. 5 and 6.

A single main pneumatic actuator 38 is used to raise both head assemblies 18, simultaneously, along a vertical path, as required during the operation of an insertion machine. Main actuator 38 is preferably mounted directly to frame 13 using a mounting plate 45. A piston 40 of main pneumatic actuator 38 is connected coaxially, using a threaded pin 41, to vertical portion 36 of T-bar 32 so that control of air pressure supplied to main pneumatic actuator 38 (through ports 54) causes T-bar 32 to selectively raise and lower with respect to base 12. Vertical movement of T-bar 32 causes simultaneous vertical movement of both head assemblies 18, regardless of their position along the horizontal U-axis.

A lead screw 42, centered along the U-axis, is positioned through a threaded nut 43 affixed to each mounting bracket 14, and is mounted within bearings 44 supported by vertical walls 46 of base 12. As is conventionally known, lead screw 42 includes a thread pitch which reverses direction at a center point so that rotation of lead screw 42, within bearings 44, in a first direction causes both threaded nuts 43, their respective mounting brackets 14, and therefore both head assemblies 18, to move linearly along the U-axis either toward or apart from each other A servo motor 47 is connected to lead screw 42 to rotate lead screw 42 in either direction and thereby control the linear displacement between the two head assemblies 18.

Figure 3:
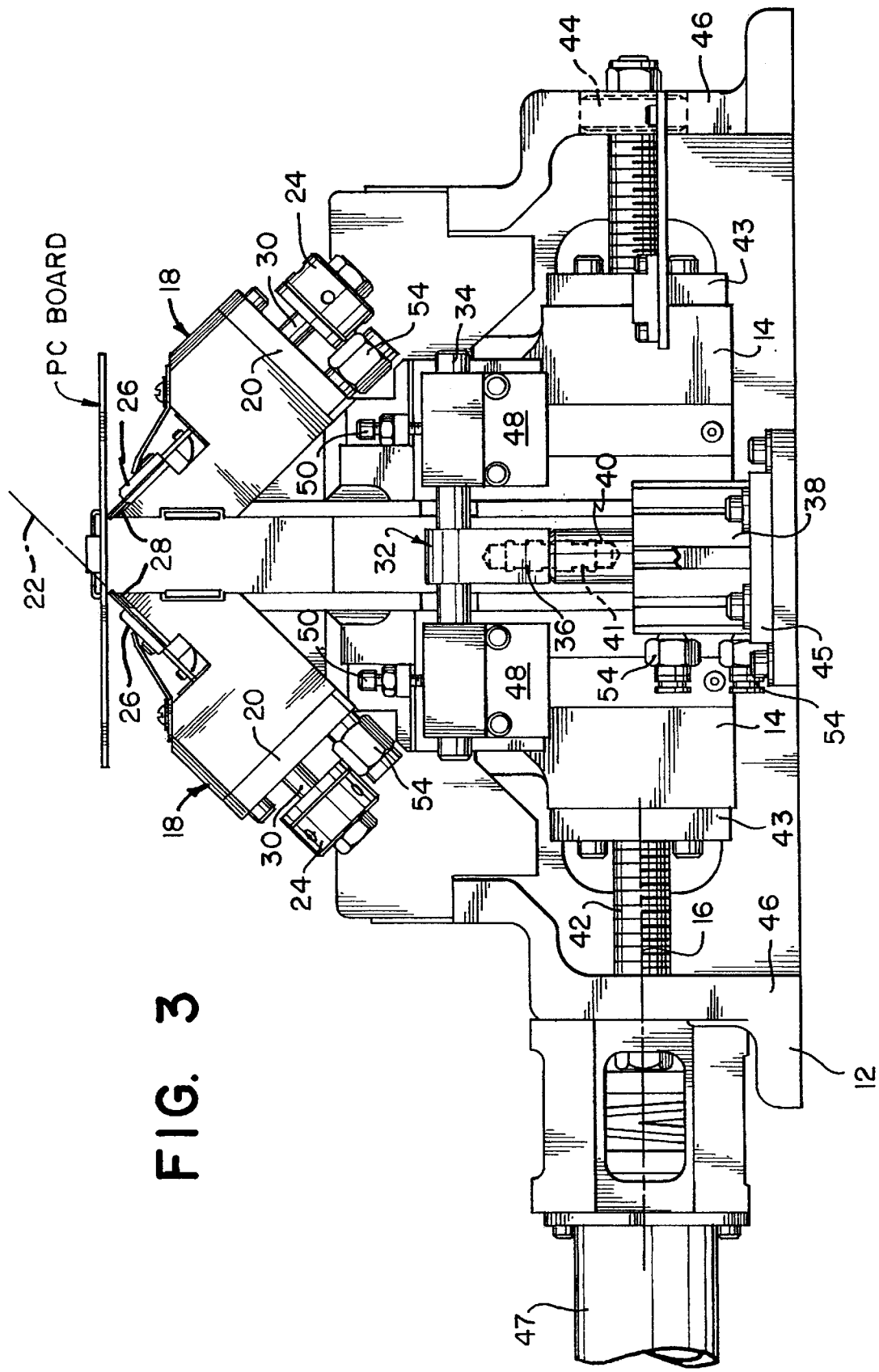
FIG. 3 is a front elevation view of the clinch assembly, showing the clinch heads located in an upper position, in accordance with the invention.
Figure 4:
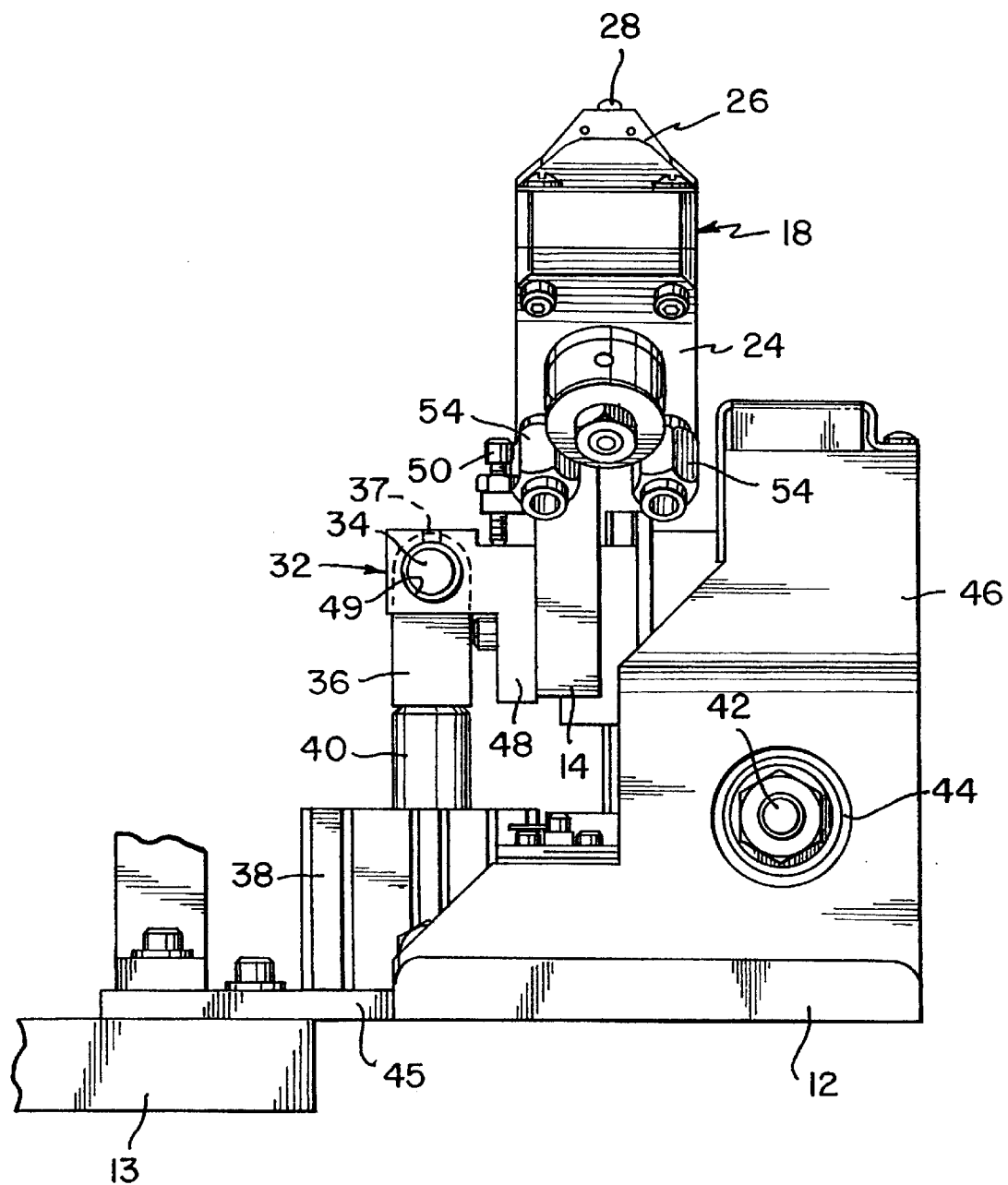
FIG. 4 is a side elevation view of the clinch assembly of FIG. 3, in accordance with the invention.
Figure 5:
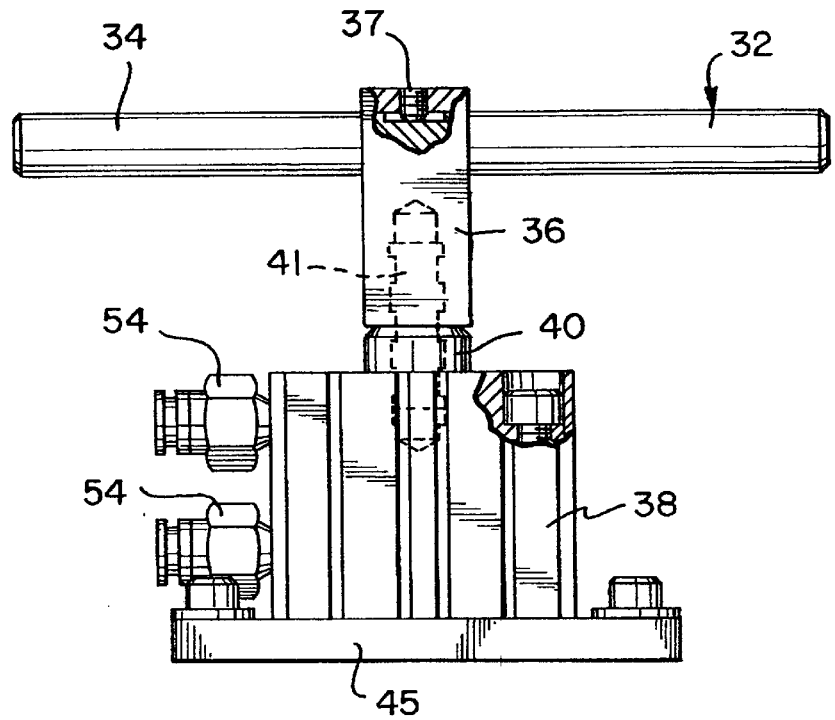
FIG. 5 is a front elevation view of a T-bar connector assembly, in accordance with the invention.
Figure 6:
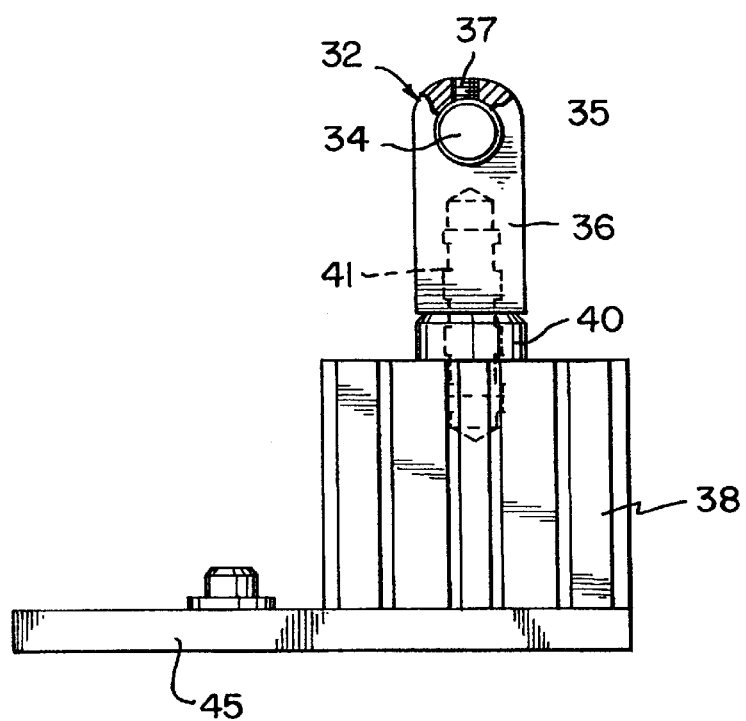
FIG. 6 is a side elevation view of the T-bar connector of FIG. 5.

T-bar 32 is connected to each mounting bracket 14 using a pillow block (or bearing sleeve) 48 having a bore 49. Horizontal portion 34 of T-bar 32 is received within bore 49 of each pillow block 48 and allowed to slide horizontally therealong. Vertical movement of T-bar 32, however, simultaneously displaces both mounting brackets 14 vertically with respect to the PC board. Each pillow block 48 is vertically adjustable with respect to each head assembly 18, using an adjustment screw 50 that is rotatably attached to a portion of each head assembly 18. Rotation of each adjustment screw 50 forces each head assembly 18 to move vertically with respect to each pillow block 48. Adjustment is made to ensure that each cutting blade resides at a proper cutting position with respect to the PC board (as shown in FIG. 3) during a cutting operation.

T-bar 32 allows both head assemblies 18 to be moved, at any time, both horizontally along the U-axis when servo motor 47 is activated and lead screw 42 rotates, and vertically when main pneumatic actuator 38 is activated.

One advantage of the clinch assembly, in accordance with the present invention, is that use of the T-bar requires only a single pneumatic actuator to raise and lower both head assemblies, thereby reducing the complexity and cost of the clinch assembly 10. Furthermore, because main pneumatic cylinder 38 raises only head assemblies 18, a relatively light mass, it is able to complete its lifting cycle quickly. In contrast, prior art clinch assemblies either require a single pneumatic cylinder to raise both the head assemblies and the lead screw/servo motor assembly, or use two pneumatic actuators to raise each head assembly independently wherein the servo motor is burdened by the mass of each of the two cylinders as it moves the head assemblies horizontally. In the present invention, servo motor 47 is not burdened in moving the mass of main pneumatic cylinder 38, only the mass of head assemblies 18 and mounting brackets 14. Main pneumatic cylinder 38 is mounted stationary with respect to base 12. In this manner, neither the vertical drive actuators (i.e., main pneumatic cylinder 38) nor the horizontal drive actuators (i.e., servo motor 47 or lead screw 42) is moved during respective vertical and horizontal displacement of head assemblies 18.

Figure 2:
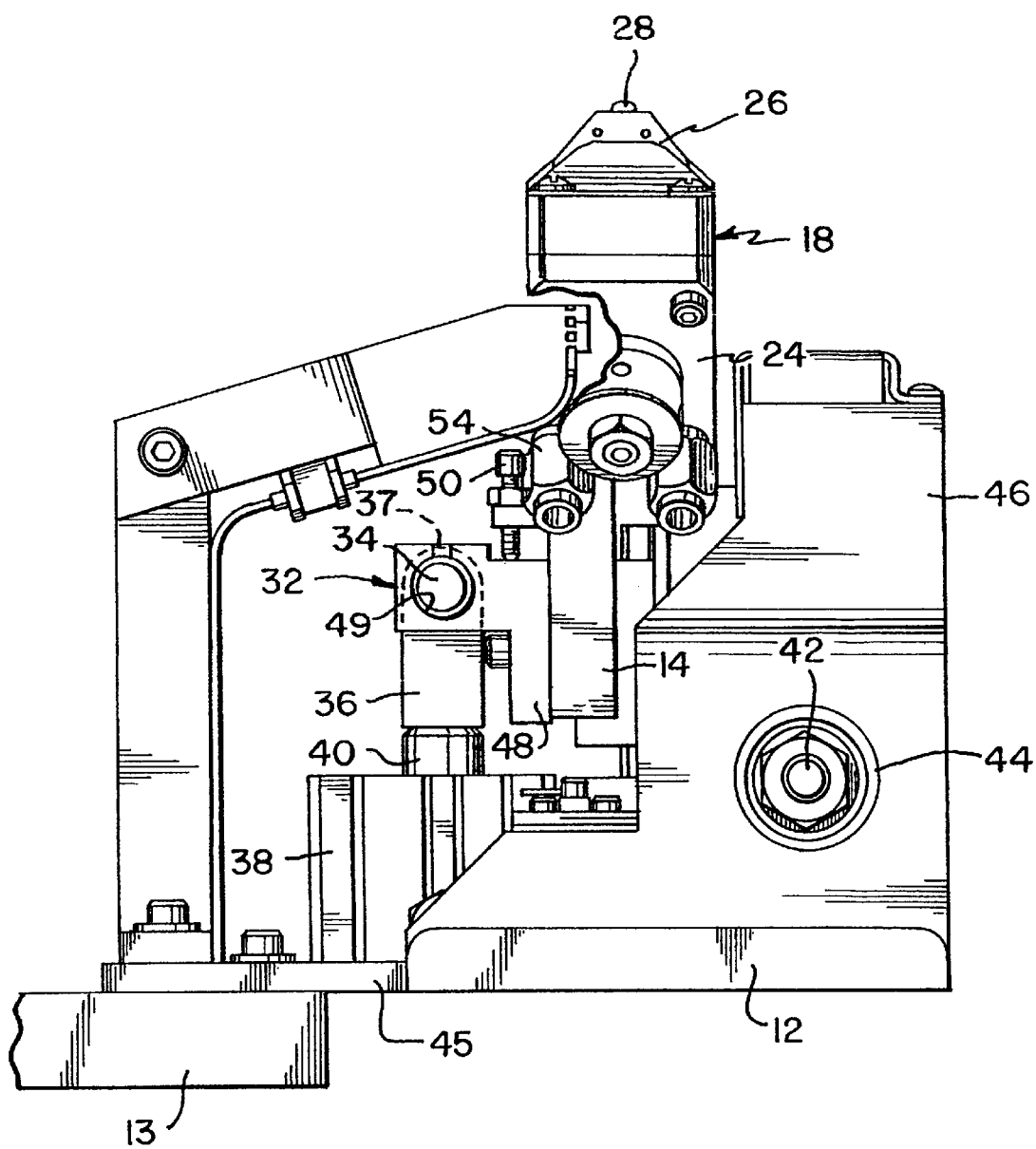
FIG. 2 is a side elevation view of the clinch assembly of FIG. 1, in accordance with the invention.

In operation, during or just after the PC board has relocated to a new insertion position, the clinch head assembly of an insertion machine begins a clinching cycle with head assemblies 18 in a lowered position, as shown in FIGS. 1 and 2. Signals are first sent to servo motor 47 to properly space head assemblies 18 apart from each other, according to the size of the component being inserted. As servo motor 47 is activated, lead screw 42 rotates causing both nuts 43 and mounting brackets 14 to move horizontally with respect to each other and frame 13. Main actuator 38 remains stationary with respect to the frame.

Once head assemblies 18 are properly distanced from each other, a predetermined amount of air pressure is applied to main actuator 38 which causes T-bar 32 to raise vertically a predetermined amount. T-bar 32 simultaneously forces each head assembly 18 to move from a lowered position, as shown in FIGS. 1 and 2, to a raised and clinching position, shown in FIGS. 3 and 4. Once in the raised position, each head assembly 18 activates to cut and clinch the leads of an inserted component, as is known in the art. Completion of the clinching cycle includes main actuator 38 to return head assemblies 18 to the lowered position shown in FIGS. 1 and 2.

Owing to the simple construction of the invention, head assemblies 18 may be quickly and easily removed for repair or cutting-blade replacement, thereby minimizing downtime of the manufacturing equipment. To remove either or both head assemblies 18 from their respective mounting bracket 14, set screw 37 is loosened and horizontal portion 34 of T-bar 32 is removed from bore 35 of vertical portion 36 and from each pillow block 48. Once horizontal portion 34 is removed, either or both head assemblies may be removed from each respective mounting bracket 14 without disturbing or otherwise changing vertical displacement adjustments already set in the machine. Head assemblies 18 may be easily re-attached to each respective mounting block 14 and horizontal portion 34 inserted through both bores 49 of each pillow block, and bore 35 of vertical portion 36. Since use of T-bar 32 retains previous adjustments, no such maintenance is required and the clinching assembly may be operational immediately.

Without departing from the gist of the present invention, head assemblies 18 may be moved along U-axis 42 using other drive means including linear motors, solenoids, pneumatic actuators or hydraulic actuators. Similarly, main pneumatic actuator 38 may be substituted with another type of suitable drive mechanisms including an electric linear motor, a solenoid, an electric motor connected to a lead screw and engaging a threaded nut, or an hydraulic actuator. Furthermore, horizontal portion 34 and vertical portion 36 of T-bar may be made integrally as a single element.

What is claimed is:

1. A clinch head assembly for use with an insertion machine for inserting lead wires of electronic components into a circuit board, said clinch head assembly being of the type including two head assemblies, each of said head assemblies having means to clinch the lead wires of an inserted component, said clinch head assembly comprising:

a frame defining a horizontal axis and a vertical axis;

means for slidably mounting said head assemblies to said frame;

a linkage mechanically connecting said head assemblies to each other so that both head assemblies move together when said linkage is displaced along said vertical axis;

means for vertically displacing said linkage along said vertical axis; and means for selectively displacing said head assemblies along said horizontal axis independently of the position of said head assemblies along said vertical axis.

2. The clinch head assembly according to claim 1, wherein said linkage is a T-shaped element having a horizontal portion connected said head assemblies to each other and a vertical portion connected to a displacement actuator.

3. The clinch head assembly according to claim 2, wherein said displacement actuator is a pneumatically powered device.

4. The clinch head assembly according to claim 1, wherein said vertical displacement means includes a pneumatically powered actuator.

5. The clinch head assembly according to claim 1, wherein said horizontal displacement means includes a servo motor connected to a lead screw, and said head assemblies each include a threaded nut which is adapted to engage said lead screw so that rotation of said lead screw displaces said threaded nuts and said head assemblies along said horizontal axis.

6. A clinch head assembly for use with an insertion machine for inserting lead wires of electronic components into a circuit board, said clinch head assembly being of the type including two head assemblies, each of said head assemblies having means to clinch the lead wires of an inserted component, said clinch head assembly comprising:

a frame defining a horizontal axis and a vertical axis;

means for slidably mounting said head assemblies to said frame;

a T-shaped linkage defining a vertical portion and two opposing horizontal portions, each of said horizontal portions being slidably connected to each respective head assembly so that both head assemblies move together along said vertical axis when said linkage is displaced along said vertical axis, said head assemblies being independently slidable along said horizontal portions of said T-shaped linkage relative to said vertical portion;

a single actuator movably connected to said vertical portion of said T-shaped linkage, so that actuation of said actuator selectively moves said T-shaped linkage along said vertical axis; and means for selectively displacing said head assemblies along said horizontal axis independently of the position of said T-shaped linkage along said vertical axis.

7. The clinch head assembly of claim 6, wherein said single actuator is actuated pneumatically.

* * * * *